(12) United States Patent
Lin et al.

(10) Patent No.: US 7,566,935 B2
(45) Date of Patent: Jul. 28, 2009

(54) ESD STRUCTURE WITHOUT BALLASTING RESISTORS

(75) Inventors: Shu Huei Lin, Hsinchu (TW); Jian Hsing Lee, Hsin-Chu (TW); Shao Chang Huang, Hsin-Chu (TW); Cheng Hsu Wu, Hsin-Chu County (TW); Chuan Ying Lee, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 326 days.

(21) Appl. No.: 11/713,193

(22) Filed: Mar. 1, 2007

(65) Prior Publication Data
US 2008/0211027 A1 Sep. 4, 2008

(51) Int. Cl.
*H01L 23/62* (2006.01)
(52) U.S. Cl. ............... 257/355; 257/170; 257/356; 257/409; 257/484
(58) Field of Classification Search ............ 257/170, 257/355, 356, 409, 484
See application file for complete search history.

(56) References Cited

U.S. PATENT DOCUMENTS

| | | | | |
|---|---|---|---|---|
| 6,448,123 B1 * | 9/2002 | Lee et al. | ...... | 438/200 |
| 6,576,934 B2 * | 6/2003 | Cheng et al. | ...... | 257/107 |
| 6,661,060 B2 * | 12/2003 | Lee et al. | ...... | 257/355 |
| 6,987,303 B2 * | 1/2006 | Yu | ...... | 257/371 |
| 7,179,691 B1 * | 2/2007 | Lee et al. | ...... | 438/135 |
| 7,485,930 B2 * | 2/2009 | Lee et al. | ...... | 257/355 |
| 2003/0047786 A1 * | 3/2003 | Lee et al. | ...... | 257/355 |

OTHER PUBLICATIONS

Ker, Ming-Dou, "ESD Protection Design on Analog Pin with Very Low Input Capacitance for High-Frequency or Current-Mode Applications", IEEE Journal of Solid-State Circuits, vol. 35, No. 8, Aug. 2000, pp. 1194-1199.

* cited by examiner

*Primary Examiner*—Victor A Mandala
(74) *Attorney, Agent, or Firm*—K & L Gates LLP

(57) ABSTRACT

An electrostatic discharge (ESD) structure connected to a bonding pad in an integrated circuit comprising: a P-type substrate with one or more first P+ regions connected to a low voltage supply (GND), a first Nwell formed in the P-type substrate, one or more second P+ regions disposed inside the first Nwell and connected to the bonding pad, at least one first N+ region disposed outside the first Nwell but in the P-type substrate and connected to the GND, at least one second N+ region disposed outside the first Nwell but in the P-type substrate and connected to the bonding pad, wherein the second N+ region is farther away from the first Nwell than the first N+ region, and at least one conductive material disposed above the P-type substrate between the first and second N+ regions and coupled to the GND, wherein the first N+ region, the second N+ region and the conductive material form the source, drain and gate of an NMOS transistor, respectively, and the first P+ region is farther away from the first Nwell than the NMOS transistor.

20 Claims, 2 Drawing Sheets

ESD STRUCTURE WITHOUT BALLASTING RESISTORS

BACKGROUND

The present invention relates generally to integrated circuit designs, and more particularly to electrostatic discharge (ESD) structures and circuits.

On-chip ESD protection mechanisms generally work in two ways. First, by dissipating the ESD current transient safely using a low-impedance discharging channel that prevents thermal damages in the structures of the integrated circuit. Secondly, by clamping any ESD induced voltage to a safe level to avoid dielectric degradation or rupture. Ideally the complete ESD protection solution should be realized on the integrated circuit (IC) creating an effective discharging channel from any pin to every other pin on the integrated circuit.

Devices that are used as ESD protection elements include diodes, bipolar transistors, MOSFETs and silicon-controlled rectifiers (SCRs). SCRs function as switches that can be configured to turn on and shunt voltage from the input and output pads of an integrated circuit to ground.

In ESD protection some integrated circuit elements may be more readily damaged by discharges occurring within automated equipment, while others may be more prone to damage from handling by personnel. This can occur from direct transfer of electrostatic charge from the human body or from a charged material to the electrostatic discharge sensitive (ESDS) element. When one walks across a floor, an electrostatic charge accumulates on the body. Simple contact of a finger to the leads of an ESDS device or assembly allows the body to discharge, possibly causing device damage. The model used to simulate this event is the Human Body Model (HBM).

The HBM testing model represents the discharge from the fingertip of a standing individual delivered to the device. It is modeled by a 100 pF capacitor discharged through a switching component and a 1.5 kOhm series resistor into the component. Typically, integrated circuit designers would like to see protection from the HBM testing to be greater than 2,000 volts.

An electrostatic discharge can also occur from a charged conductive object, such as a metallic tool or fixture. To test for this, designers use the Machine Model (MM). The machine model consists of a 200 pF capacitor discharged directly into a circuit without a series resistor. Typically, integrated circuit designers would like to see protection from the machine model to be greater than 200 volts.

Generally, to protect against ESD stress in CMOS ICs, an ESD protection structure consisting of several circuits is added to the ICs. A conventional ESD protection circuit has a two-stage structure for the device input pins. Generally the first stage is a robust device, such as an SCR, a field-oxide device, or a long-channel NMOS transistor, that functions as a primary protection device to discharge ESD current. The second stage is generally a gate-grounded short-channel NMOS transistor that functions as a secondary protection device to clamp the overstress voltage. Between the first stage and the second stage of the input ESD protection circuit, a resistor is added to limit the ESD current flowing through the second stage ESD clamp device. The value of this resistor is dependent on the turn-on voltage of the first stage ESD clamp device and the secondary breakdown current of the second stage ESD clamp device. Such resistance is designed large enough so the first stage ESD device can be triggered on to bypass ESD current before the second stage ESD clamp device is damaged by ESD. Such two-stage ESD protection design can provide high a ESD protection level for the digital input pins, but the series resistance and the junction capacitance in the ESD protection devices cause a resistive and capacitive effect that is not suitable for many analog circuits, especially for high frequency or current-mode applications.

As such, what is needed is an improved ESD protection structure.

SUMMARY

The present disclosure provides an electrostatic discharge (ESD) structure connected to a bonding pad in an integrated circuit comprising: a P-type substrate with one or more first P+ regions connected to a low voltage supply (GND), a first Nwell formed in the P-type substrate, one or more second P+ regions disposed inside the first Nwell and connected to the bonding pad, at least one first N+ region disposed outside the first Nwell but in the P-type substrate and connected to the GND, at least one second N+ region disposed outside the first Nwell but in the P-type substrate and connected to the bonding pad, wherein the second N+ region is farther away from the first Nwell than the first N+ region, and at least one conductive material disposed above the P-type substrate between the first and second N+ regions and coupled to the GND, wherein the first N+ region, the second N+ region and the conductive material form the source, drain and gate of an NMOS transistor, respectively, and the first P+ region is farther away from the first Nwell than the NMOS transistor.

The construction and method of operation of the invention, however, together with additional objectives and advantages thereof will be best understood from the following description of specific embodiments when read in connection with the accompanying drawings.

DESCRIPTION

Figure 1:
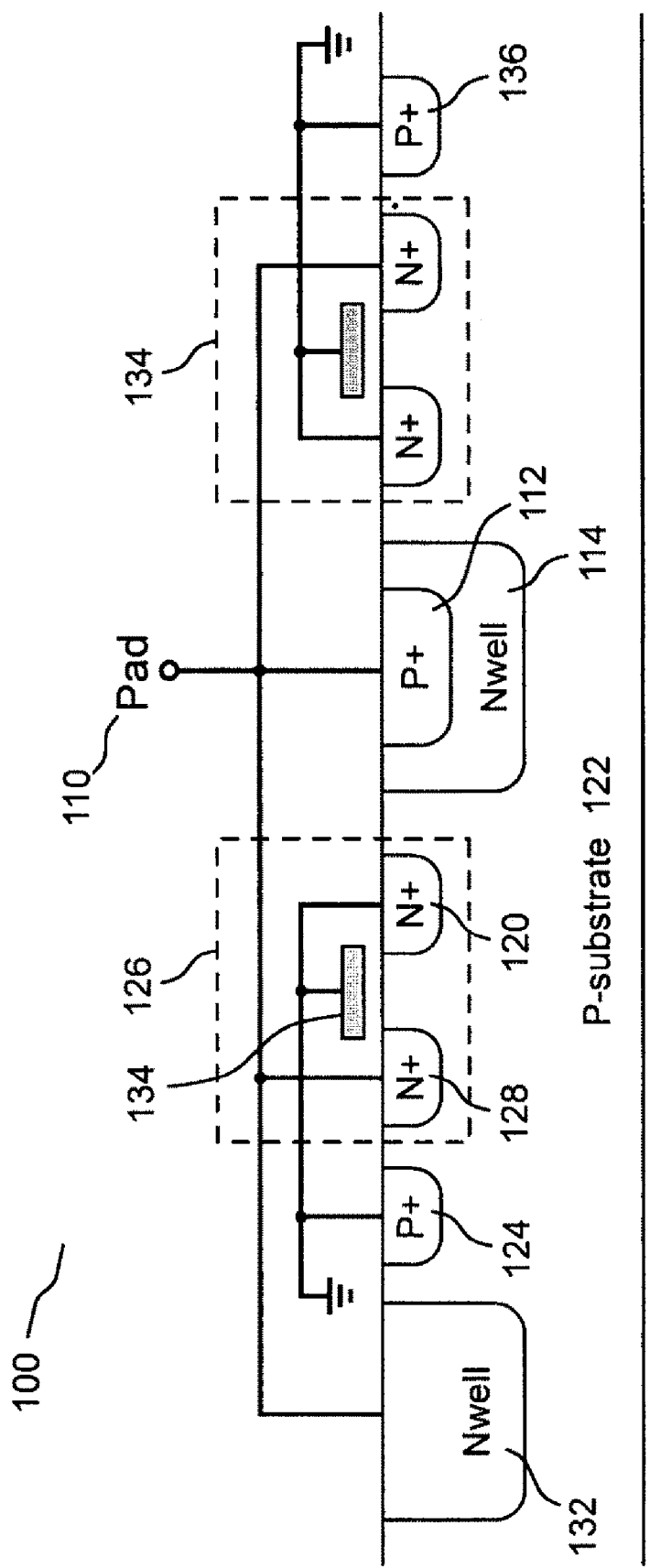
FIG. 1 shows a cross section of one embodiment of the current invention.

FIG. 1 shows a cross sectional diagram of an electrostatic discharge (ESD) structure 100 for one embodiment of the current invention. A bonding pad 110 is connected to a first P+ region 112 and to a second N+ region 128. The first P+ region 112 is formed inside an Nwell region 114. A first N+ region 120 and second P+ region 124 are connected to a ground (GND). The Nwell region 114, the second N+ region 128, the first N+ region 120 and the second P+ region 124 are formed in a P-type substrate 122. The first P+ region 112, the NW region 114, the P-type substrate 122 and the N+ region 120 combine to form an SCR having one terminal connected to the pad, and the other terminal connected to the ground.

The first N+ region 120 with the second N+ region 128 form an NMOS device 126 controlled by a gate 116. In this embodiment, the gate 116 is disposed above the P-type region between the second N+ region 128 and the first N+ region 120. Gate 116 is connected to a ground. The NMOS device 126 has a source N+ region 120, and a drain N+ region 128. One aspect of the current invention is the combined SCR NMOS structure whereby part of an NMOS device 126 also constitutes part of a robust device, such as an SCR.

The P+ regions 124 and 136 form a guard ring that may partially or completely surround the ESD structure and may be formed as a single region or from multiple regions.

This embodiment may also have a second Nwell structure 132 disposed farther from the first Nwell structure than the NMOS device 126 and the P+ region 124 such that the second Nwell structure 132 and the P+ region 124 form a diode for protection against alternative polarity ESD voltages.

In a conventional ESD structure design, an NMOS device functions as a triggering device for an SCR. The NMOS device is generally made with a resist protective oxide layer (RPO) in the drain region. The RPO layer blocks silicidation on the drain region such that resistive ballasting will be enhanced and hotspots caused by the ESD currents will be minimized. In this embodiment the drain 128 of the NMOS device 126 has a silicide layer for forming the connection to the pad, thereby eliminating the RPO layer.

One having skill in the art will appreciate that without the RPO layer, the resistance of the drain 128 of the NMOS device 126 will be reduced which is beneficial to many analog circuits, especially for high frequency or current-mode applications.

One having skill in the art will also appreciate that the structure in this embodiment can be constructed such that a plurality of NMOS devices such as 134 and guard channels 136 encompasses the Nwell of the SCR providing increased area and current carrying capacity.

Figure 2:
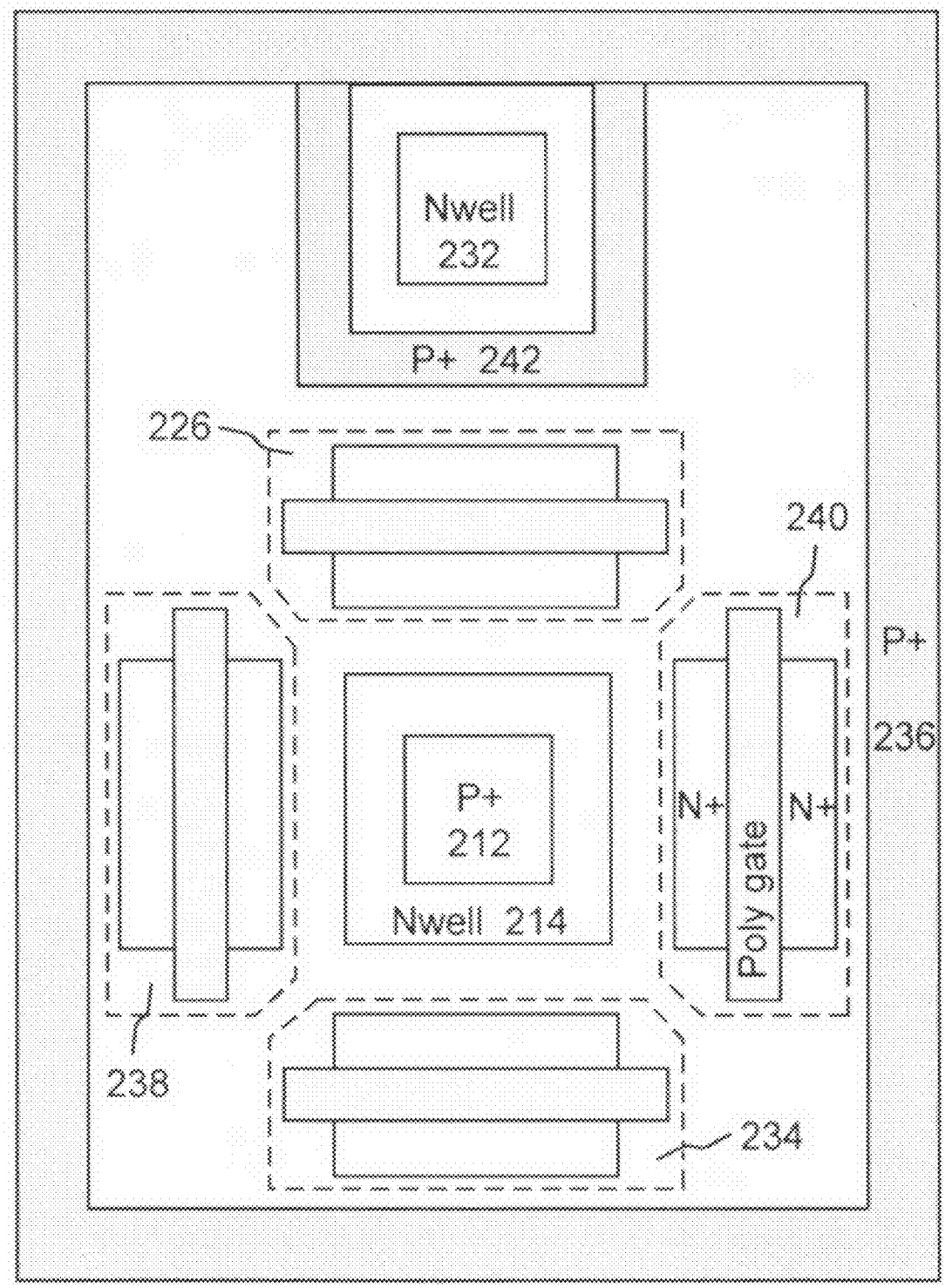
FIG. 2 shows a top view of a circuit layout according to the embodiment of the current invention as shown in FIG. 1.

FIG. 2 shows one possible layout for the cross sectional view of FIG. 1. In this layout, one or more robust devices such as SCR structures are formed from one or more P+ regions 212 disposed inside one or more Nwell regions 214 substantially surround by NMOS devices 226, 234, 238 and 240. The P+ region 212 is connected to a bonding pad. The Nwell region 214 is disposed in a P-type substrate 222.

Disposed around the Nwell region 214 are one or more surrounding NMOS devices 226, 234, 238 and 240. Each surrounding NMOS device has a source and a gate connected to a GND and a drain connected to the bonding pad. The NMOS devices 226, 234, 238 and 240 are constructed such that the source is closer to the Nwell region 214 than the drain. Disposed in the ESD structure can be a diode structure of Nwell 232 inside the P-type substrate with a P+ region 242 as a P-type substrate pick-up. The diode structure provides additional protection from alternative polarity ESD. The entire ESD structure may also be surrounded by a P+ region 236 that functions as a guard ring.

In this embodiment the drains of the surrounding NMOS devices 226, 234, 238 and 240 may have a silicide layer for forming the connection to the pad, thereby eliminating the RPO layer.

This embodiment provides for a larger total cross section of a robust device such as an SCR, to more easily conduct ESD current to the GND.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

The above illustration provides many different embodiments or embodiments for implementing different features of the invention. Specific embodiments of components and processes are described to help clarify the invention. These are, of course, merely embodiments and are not intended to limit the invention from that described in the claims.

What is claimed is:

1. An electrostatic discharge (ESD) structure connected to a bonding pad in an integrated circuit comprising:
   a P-type substrate with one or more first P+ regions connected to a low voltage supply (GND);
   a first Nwell formed in the P-type substrate;
   one or more second P+ regions disposed inside the first Nwell and connected to the bonding pad;
   at least one first N+ region disposed outside the first Nwell but in the P-type substrate and connected to the GND;
   at least one second N+ region disposed outside the first Nwell but in the P-type substrate and connected to the bonding pad, wherein the second N+ region is farther away from the first Nwell than the first N+ region; and
   at least one conductive material disposed above the P-type substrate between the first and second N+ regions and coupled to the GND;
   wherein the first N+ region, the second N+ region and the conductive material form the source, drain and gate of an NMOS transistor, respectively, and the first P+ region is farther away from the first Nwell than the NMOS transistor.

2. The ESD structure of claim 1 wherein the conductive material is polysilicon.

3. The ESD structure of claim 1, wherein the second N+ region has a silicide layer for forming the connection to the pad.

4. The ESD structure of claim 1 wherein the NMOS transistor substantially encompasses the Nwell.

5. The ESD structure of claim 1, wherein the first P+ region substantially encompasses the both the Nwell and the NMOS transistor serving both as a bulk pick-up for the NMOS transistor and as a guard ring for the ESD structure.

6. The ESD structure of claim 1, wherein the P-type substrate is a Pwell.

7. The ESD structure of claim 1 further comprising one or more second Nwell region disposed in the P-type substrate connected to the bonding pad and separated from both the first Nwell and the NMOS transistor by the first P+ region, wherein the Nwell and the P-type substrate form a diode.

8. The ESD structure of claim 7, wherein the first P+ region substantially encompasses the second Nwell region.

9. An electrostatic discharge (ESD) structure connected to a bonding pad in an integrated circuit comprising:
   a first Nwell formed in a P-type substrate;
   one or more first P+ regions disposed inside the first Nwell and connected to the bonding pad;
   at least one first N+ region disposed outside the first Nwell but in the P-type substrate and connected to a low voltage supply (GND) wherein the one or more first N+ region substantially encompasses the first Nwell;
   at least one second N+ region disposed outside the first Nwell but in the P-type substrate and connected to the bonding pad, wherein the second N+ region is farther away from the first Nwell than the first N+ region and substantially encompasses the first Nwell;
   at least one conductive material disposed above the P-type substrate between the first and second N+ regions and coupled to the GND; and
   one or more second P+ regions disposed in the P-type substrate and connected to the GND,
   wherein the first N+ region, the second N+ region and the conductive material form the source, drain and gate of an NMOS transistor, respectively, and the second P+ region is farther away from the first Nwell than the NMOS transistor.

10. The ESD structure of claim 9 wherein the conductive material is polysilicon.

11. The ESD structure of claim 9, wherein the second N+ region has a silicide layer for forming the connection to the pad.

12. The ESD structure of claim 9, wherein the second P+ region serves both as a bulk pick-up for the NMOS transistor and as a guard ring for the ESD structure.

13. The ESD structure of claim 9, wherein the P-type substrate is a Pwell.

14. The ESD structure of claim 9 further comprising one or more second Nwell region disposed in the P-type substrate connected to the bonding pad and separated from both the first Nwell and the NMOS transistor by the second P+ region, wherein the second Nwell and the P-type substrate form a diode.

15. The ESD structure of claim 14, wherein a third P+ region substantially encompasses the second Nwell region.

16. An electrostatic discharge (ESD) structure connected to a bonding pad in an integrated circuit comprising:
   a first Nwell formed in a P-type substrate;
   one or more first P+ regions disposed inside the first Nwell and connected to the bonding pad;
   at least one first N+ region disposed outside the first Nwell but in the P-type substrate and connected to a low voltage supply (GND) wherein the one or more first N+ region substantially encompasses the first Nwell;
   at least one second N+ region disposed outside the first Nwell but in the P-type substrate and connected to the bonding pad through a silicide layer, wherein the second N+ region is farther away from the first Nwell than the first N+ region and substantially encompasses the first Nwell;
   at least one conductive material disposed above the P-type substrate between the first and second N+ regions and coupled to the GND; and
   one or more second P+ regions disposed in the P-type substrate and connected to the GND,
   wherein the first N+ region, the second N+ region and the conductive material form the source, drain and gate of an NMOS transistor, respectively, and the second P+ region is farther away from the first Nwell than the NMOS transistor.

17. The ESD structure of claim 16, wherein the second P+ region serves both as a bulk pick-up for the NMOS transistor and as a guard ring for the ESD structure.

18. The ESD structure of claim 16, wherein the P-type substrate is a Pwell.

19. The ESD structure of claim 16 further comprising one or more second Nwell region disposed in the P-type substrate connected to the bonding pad and separated from both the first Nwell and the NMOS transistor by the second P+ region, wherein the second Nwell and the P-type substrate form a diode.

20. The ESD structure of claim 19, wherein a third P+ region substantially encompasses the second Nwell region.

* * * * *